US009241421B2

(12) United States Patent
Gektin et al.

(10) Patent No.: US 9,241,421 B2
(45) Date of Patent: Jan. 19, 2016

(54) CENTRALIZED CHASSIS ARCHITECTURE FOR HALF-WIDTH BOARDS

(71) Applicant: FutureWei Technologies, Inc., Plano, TX (US)

(72) Inventors: Vadim Gektin, San Jose, CA (US); Jiye Xu, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 223 days.

(21) Appl. No.: 13/955,218

(22) Filed: Jul. 31, 2013

(65) Prior Publication Data

US 2015/0036280 A1 Feb. 5, 2015

(51) Int. Cl.
*H05K 5/00* (2006.01)
*H05K 7/14* (2006.01)
*H05K 7/20* (2006.01)

(52) U.S. Cl.
CPC ............ *H05K 7/1489* (2013.01); *H05K 7/1452* (2013.01); *H05K 7/1487* (2013.01); *H05K 7/20727* (2013.01); *H05K 7/20754* (2013.01)

(58) Field of Classification Search
USPC ............ 361/784, 785, 679.01, 748, 788, 796, 361/801; 439/476.1, 483, 327, 328, 296; 385/134, 135
See application file for complete search history.

(56) References Cited

U.S. PATENT DOCUMENTS

| | | | | |
|---|---|---|---|---|
| 4,862,161 A | * | 8/1989 | Schomers | 340/2.22 |
| 6,198,633 B1 | * | 3/2001 | Lehman et al. | 361/756 |
| 6,853,551 B2 | * | 2/2005 | Baar et al. | 361/679.33 |
| 6,999,319 B2 | * | 2/2006 | Wu et al. | 361/724 |
| 7,764,511 B2 | * | 7/2010 | Lee et al. | 361/796 |
| 7,894,195 B2 | * | 2/2011 | Lin | 361/727 |
| 8,405,985 B1 | | 3/2013 | Reynov et al. | |
| 2003/0045030 A1 | | 3/2003 | Hayashida et al. | |
| 2005/0207134 A1 | * | 9/2005 | Belady et al. | 361/796 |
| 2007/0083690 A1 | * | 4/2007 | Koga et al. | 710/301 |
| 2008/0298014 A1 | * | 12/2008 | Franco | 361/688 |
| 2009/0147464 A1 | | 6/2009 | Anderl et al. | |
| 2009/0268749 A1 | | 10/2009 | Liva et al. | |

OTHER PUBLICATIONS

International Search Report received in Application No. PCT/CN2014/082688, mailed Oct. 27, 2014, 13 pages.

* cited by examiner

*Primary Examiner* — Hung S Bui
(74) *Attorney, Agent, or Firm* — Slater & Matsil, L.L.P.

(57) ABSTRACT

The thermal efficiency of dual-column chassis can be improved by re-locating line card to connection plane (LC-to-CP) interfaces to the center of the connection plane, as this allows inter line card channels (inter-LC channels) to be routed in a manner that avoids bisecting the thermal throughways over which convection cooling air is circulated to the line cards. One technique for centrally locating the LC-to-CP interfaces on the connection plane is to invert one column of line cards. Another technique for centrally locating the LC-to-CP interfaces on the connection plane is to use non-uniform line cards. An additional benefit of centrally locating the LC-to-CP interfaces on the connection plane is that the inter-LC channels extending between perpendicularly adjacent line cards are shortened, which increases server performance by virtue of reducing switching latency.

20 Claims, 7 Drawing Sheets

CENTRALIZED CHASSIS ARCHITECTURE FOR HALF-WIDTH BOARDS

TECHNICAL FIELD

The present invention relates generally to computing, and in particular embodiments, to a centralized chassis architecture for half-width boards.

BACKGROUND

Modern servers are typically designed on a modular chassis in order to allow additional line cards to be added when more capacity is needed. Modular chassis are often designed to accommodate active cooling components (e.g., fans, etc.) to regulate the temperature of the line cards housed therein. Indeed, cooling efficiency may be an important consideration during chassis design, as chassis designs that provide efficient cooling may allow servers to achieve better performance. For example, thermally efficient chassis designs may achieve reduced power consumption and/or quieter server operation by using smaller or lower duty-cycle active cooling components, as well as improved thermal dissipation for increased server longevity. Accordingly, chassis designs that allow for more effective/efficient cooling of line cards are desired.

SUMMARY OF THE INVENTION

Technical advantages are generally achieved by embodiments of this disclosure which describe a centralized chassis architecture for half-width boards.

In accordance with an embodiment, a chassis architecture is provided. In this example, the chassis architecture includes a connection plane comprising a first column of interconnections and a second column of interconnections. The first column of interconnections run parallel to the second column interconnections over the connection plane. A spacing between perpendicularly adjacent interconnections in the first column of interconnections and the second column of interconnections is less than half the width of a single line card. The chassis architecture further includes a plurality of line cards mounted to the connection plane. The plurality of line cards are arranged in a first column of line cards mounted to the first column of interconnections and a second column of line cards mounted to the second column of interconnections.

In accordance with another embodiment, a connection plane adapted for use in a dual-column chassis architecture is provided. In this example, the connection plane includes a printed circuit board (PCB) connection plane, and a plurality of line-card to connection-plane (LC-to-CP) interconnections affixed to the PCB connection plane. The plurality of LC-to-CP interconnections include a first column of LC-to-CP interconnections and a second column of LC-to-CP interconnections. The second column of LC-to-CP connections runs parallel to the second column LC-to-CP interconnections to form pairs of perpendicularly adjacent LC-to-CP interconnections. A spacing between respective interconnections in each pair of perpendicularly adjacent LC-to-CP interconnections is less than half the width of a single line card.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
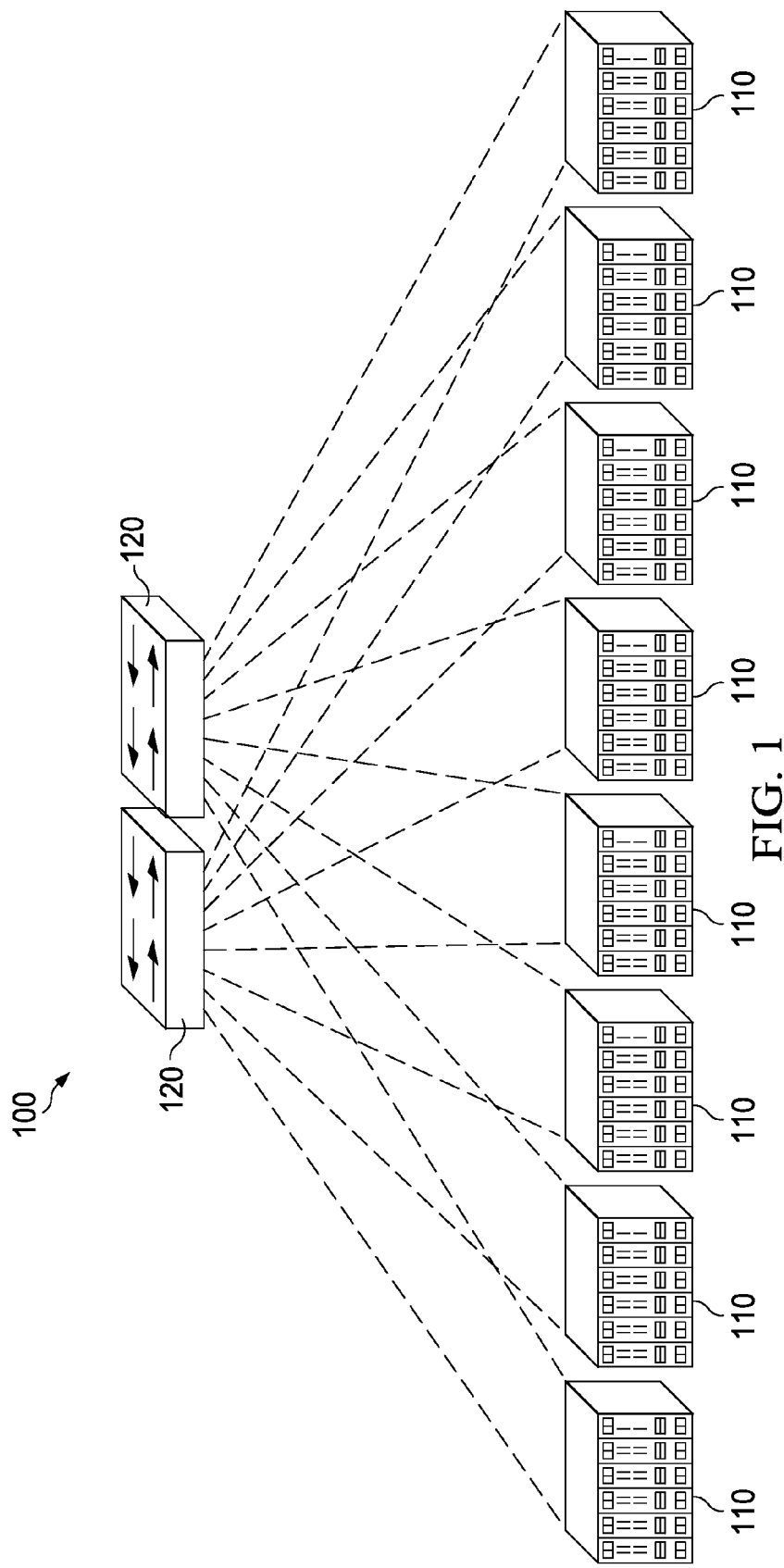
FIG. 1 illustrates a diagram of a wireless network for communicating data.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims. As used herein, the term "server" refers to any hardware and/or software component/module that is capable of being configured to provide a service (e.g., routing, computing, networking, etc.). The term "server" should not be interpreted to exclude any type or class of device unless otherwise specified.

One trend in modern server design is to use chassis architectures that support two adjacent columns of line cards, which are referred to herein as dual-column chassis. Line cards mounted in dual-column chassis are commonly referred to as "half-width boards" because they are typically half as wide as line cards in comparable single column chassis. Conventional dual-column chassis architectures are typically configured to mount all of the line cards to the connection plane in a homogenous orientation, e.g., all the line cards are mounted upright. Moreover, line cards typically have interfaces located on one side of the board, e.g., the left side. As a result, homogenous orientation of the line cards increases the horizontal spacing between perpendicularly adjacent line cards. One consequence of this increased horizontal spacing is that the inter line card (inter-LC) channels extending between perpendicularly adjacent line cards are lengthened, which reduces server performance (e.g., increased latency, etc.). Another consequence of the increased horizontal spacing is that the inter-LC channels bisect the thermal throughways over which convection cooling air is circulated to the line cards, thereby reducing the thermal efficiency of the chassis.

Aspects of this disclosure reduce the horizontal spacing between perpendicularly adjacent line cards by re-locating the line card to connection plane (LC-to-CP) interfaces towards the center of the connection plan. In one embodiment, this is achieved by inverting one column of line cards such that line cards are no longer homogenously oriented (e.g., line cards in one column are upright while line cards in the other column are upside-down). This allows line card uniformity to be maintained. Alternatively, non-uniform line cards can be used to re-locate the LC-to-CP interfaces to the center of the connection plane while maintaining a homogenous orientation, e.g., without inverting any of the line cards.

One benefit to reducing the horizontal spacing between perpendicularly adjacent line cards is that the inter-LC channels extending between perpendicularly adjacent line cards can be shortened, which increase server performance by, inter alia, reducing the time required to switch packets between line cards. An additional benefit to reducing the horizontal spacing between perpendicularly adjacent line cards is that the inter-LC channels can be routed entirely through a central structure of the connection plane to avoid bisecting the thermal throughways, which increases the thermal efficiency of the chassis by reducing air flow restrictions and reducing a pressure drop as the convention cooling air pass by the connection plane. These and other benefits derived from embodiments of this disclosure are explained in greater detail below.

FIG. 1 illustrates a network 100 comprising a plurality of servers 110 interconnected by multiple switches 120. The servers 110 may include any type of computing device, including database servers, file servers, mail servers, print servers, web servers, gaming servers, application servers, etc. One or more of the servers 110 may be installed on a chassis that houses multiple interconnected server boards or line cards. In some instances, multiple servers may be installed on a single chassis. In other instances, a single server may be installed across multiple chassis.

Figure 2A:
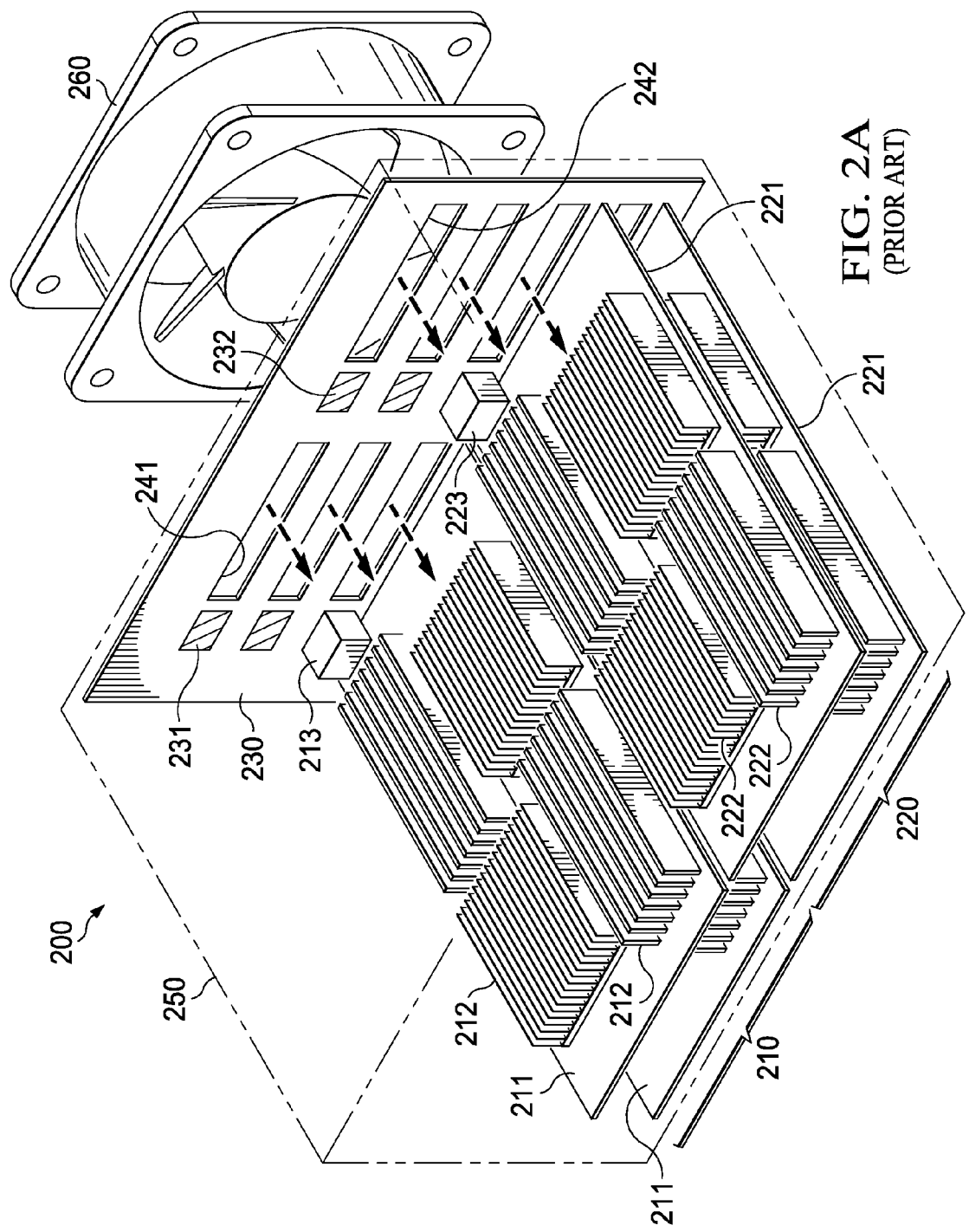
FIGS. 2A-B illustrates a conventional chassis architecture.
Figure 2B:
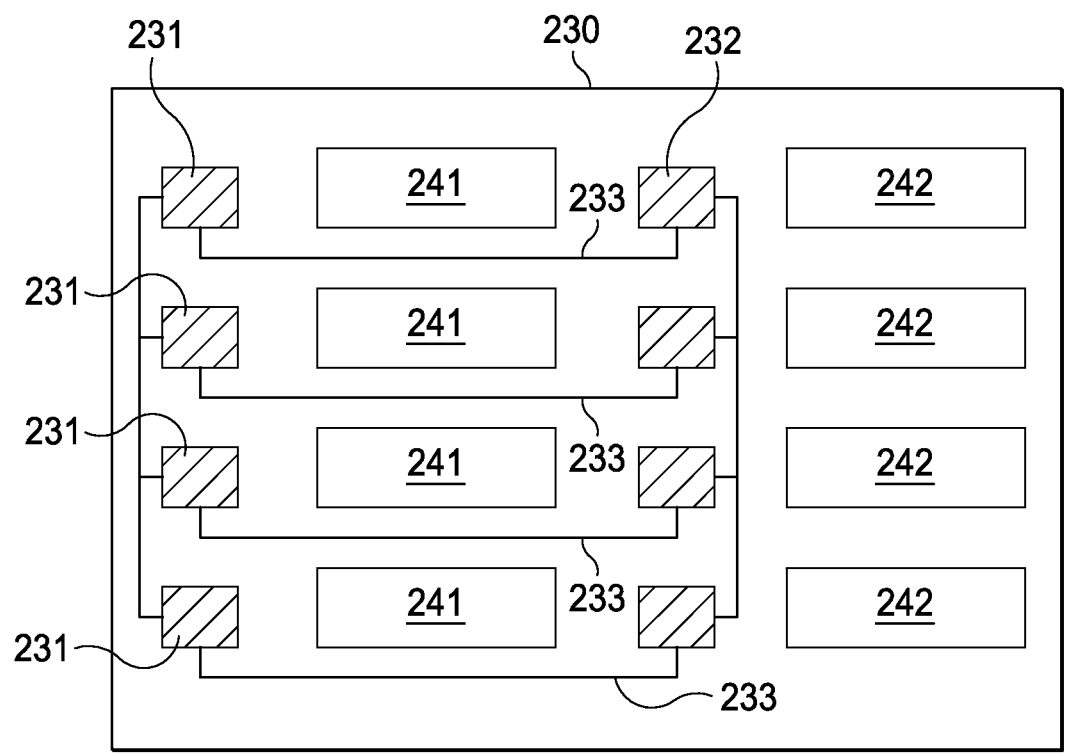

FIG. 2A illustrates a conventional chassis architecture 200 for housing a server. As shown, the conventional chassis architecture 200 comprises two columns 210, 220 of line cards 211, 221 mounted to a connection plane 230, as well as an outer shell 250 encasing the line cards 211, 221. The line cards 211, 221 are half-width boards configured to provide server/computing functionality. The line cards 211, 221 include heat sinks 212, 222 for dissipating heat into the surrounding air as well as interfaces 213, 223 for connection to (or interfacing with) the connection plane 230. The connection plane 230 may include line-card to connection-plane (LC-to-CP) interconnections 231, 232, as well as thermal throughways 241, 242 through which convection cooling air is circulated from an active cooling component 260 to the line cards 211, 221. FIG. 2B illustrates a front-on view of the connection plane 230, which depicts inter-LC channels 233 extending between perpendicularly adjacent LC-to-CP interconnections 231, 232.

One drawback to the conventional chassis architecture 200 is that the placement/location of the LC-to-CP interconnections 231, 232 causes the inter-LC channels 233 to bisect the thermal throughways 241, 242 in order to provide inter-column connectivity. Another drawback to the conventional chassis architecture 200 is that the placement/location of the LC-to-CP interconnections 231, 232 yields relatively long inter-LC channels 233. These drawbacks reduce the thermal efficiency of the chassis and reduce overall server performance.

Figure 3A:
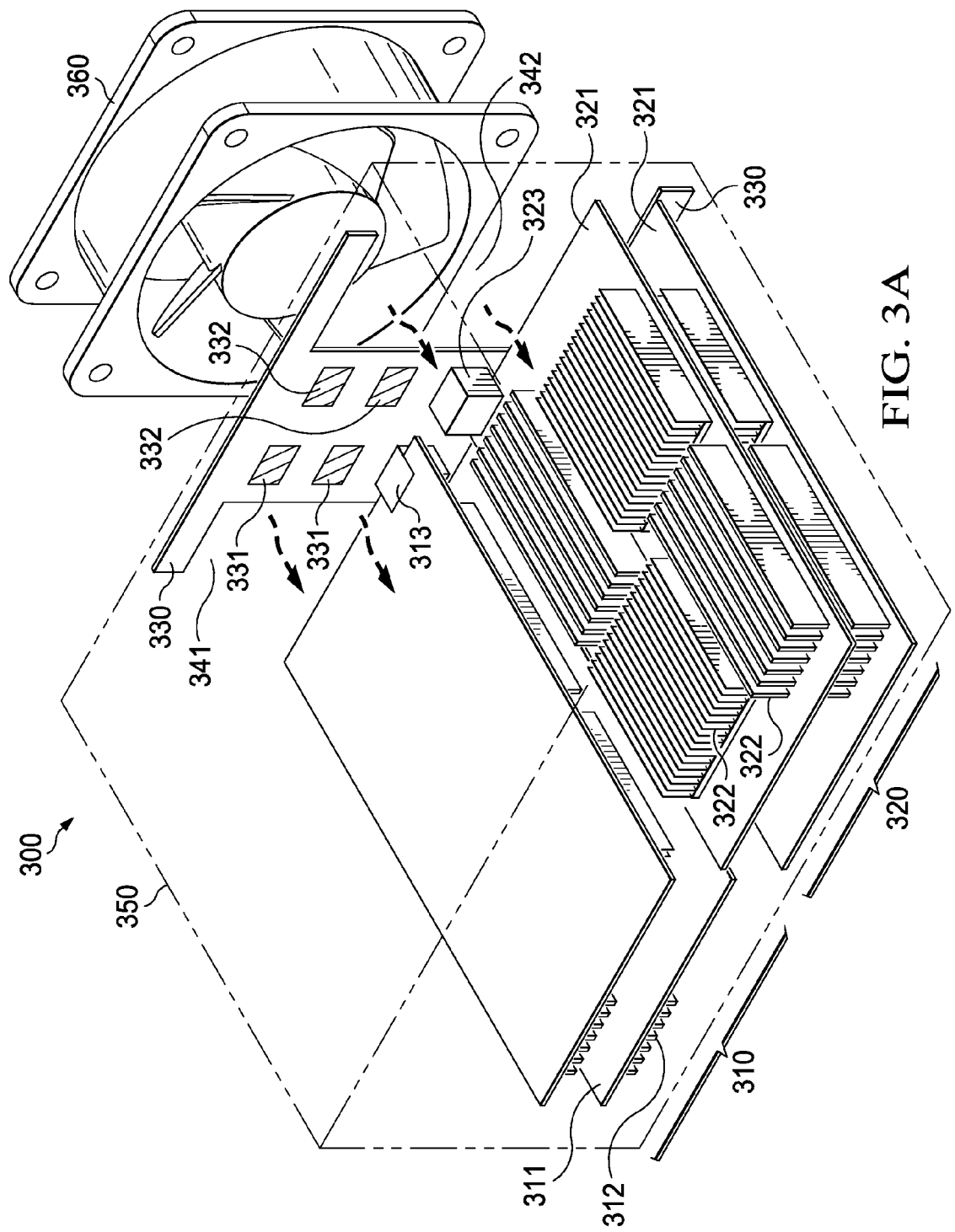
FIGS. 3A-B illustrates an embodiment chassis architecture.
Figure 3B:
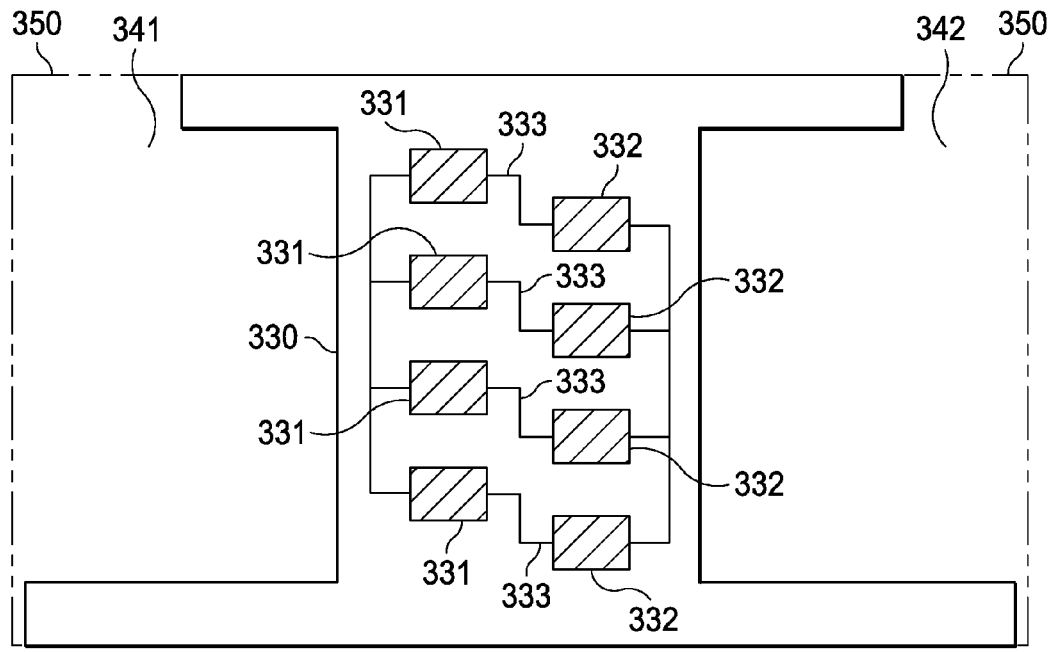

Aspects of this disclosure reduce the horizontal spacing between perpendicularly adjacent LC-to-CP interconnections by re-locating the LC-to-CP interconnections to the center of the connection plane. FIG. 3A illustrates an embodiment chassis architecture 300 in which LC-to-CP interconnections 331, 332 are located on a central structure of the connection plane 330. Notably, the As shown, the embodiment chassis architecture 300 comprises two columns 310, 320 of line cards 311, 321 mounted to the connection plane 330, as well as an outer shell 350 encasing the line cards 311, 321. The line cards 311, 321 include heat sinks 312, 322 for dissipating heat into the surrounding air as well as interfaces 313, 323 to connect to the connection plane 330. The connection plane 330 includes thermal throughways 341, 342 through which a convection cooling air-flow is circulated from an active cooling component 360 to the line cards 311, 321. FIG. 3B illustrates a front-on view of the connection plane 330. As shown, the thermal throughways are formed between the connection plane 330 and the outer shell 350. As shown, central placement of the LC-to-CP interconnections 331, 332 on the connection plane 330 allows the thermal throughway 341 to be substantially contiguous, as it is not necessary for the connection plane 330 to bisect the thermal throughway 341 in order to provide pathways for the inter-LC channels 333. The same can be said about the thermal throughway 342. Furthermore, central placement of the LC-to-CP interconnections 331, 332 allows the inter-LC channels 333 to be shortened considerably, due to a reduced horizontal spacing between perpendicularly adjacent LC-to-CP interconnections 331, 332. In some embodiments, the horizontal spacing between perpendicularly adjacent LC-to-CP interconnections 331, 332 may be less than half the width of a single line card, thereby allowing the inter-LC channels 333 to also be less than half the width of a single line card. In other embodiments, the horizontal spacing between perpendicularly adjacent LC-to-CP interconnections 331, 332 may be less than one quarter the width of a single line card, thereby allowing the inter-LC channels 333 to also be less than one quarter the width of a single line card.

Figure 4:
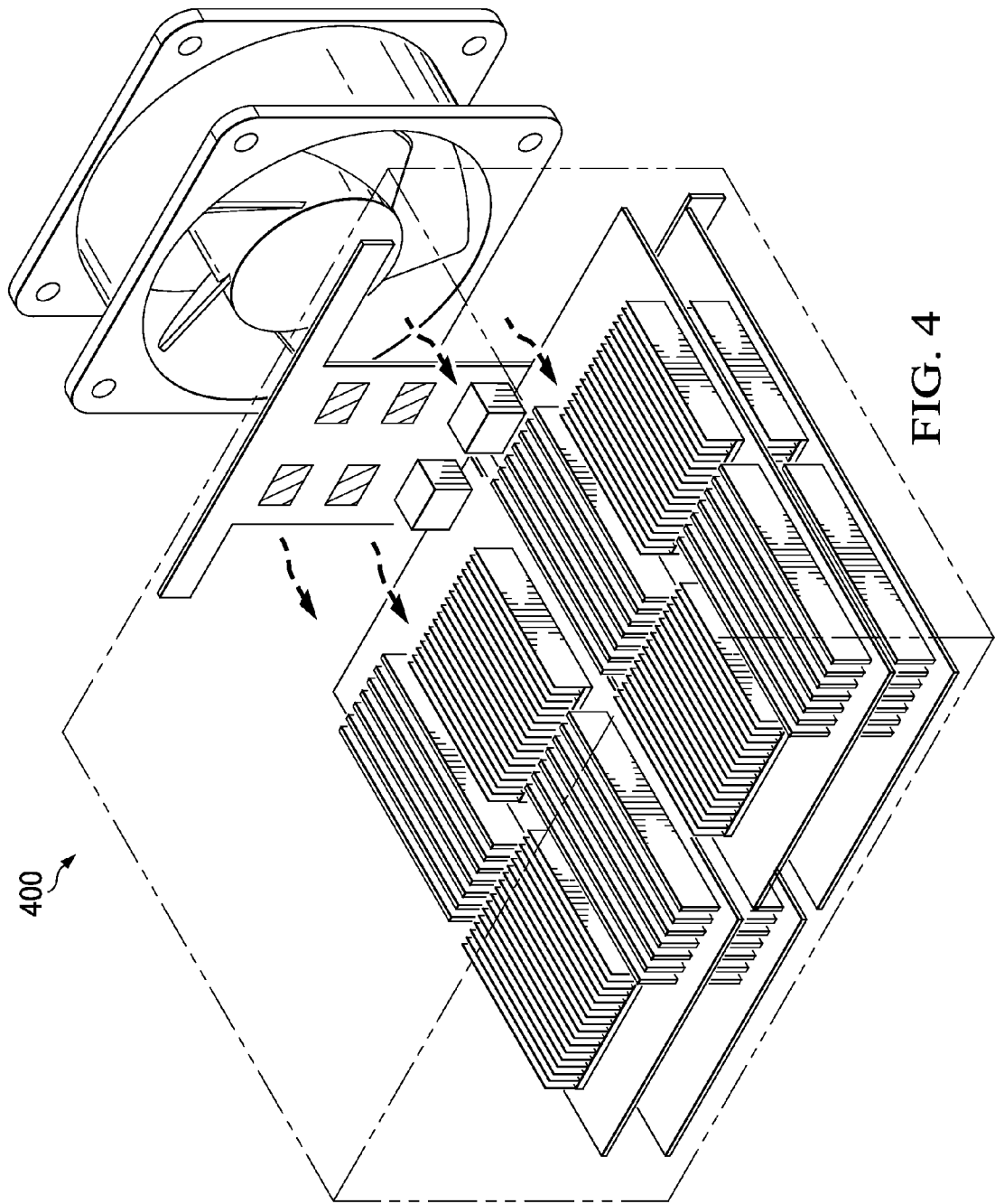
FIG. 4 illustrates another embodiment chassis architecture.
Figure 5:
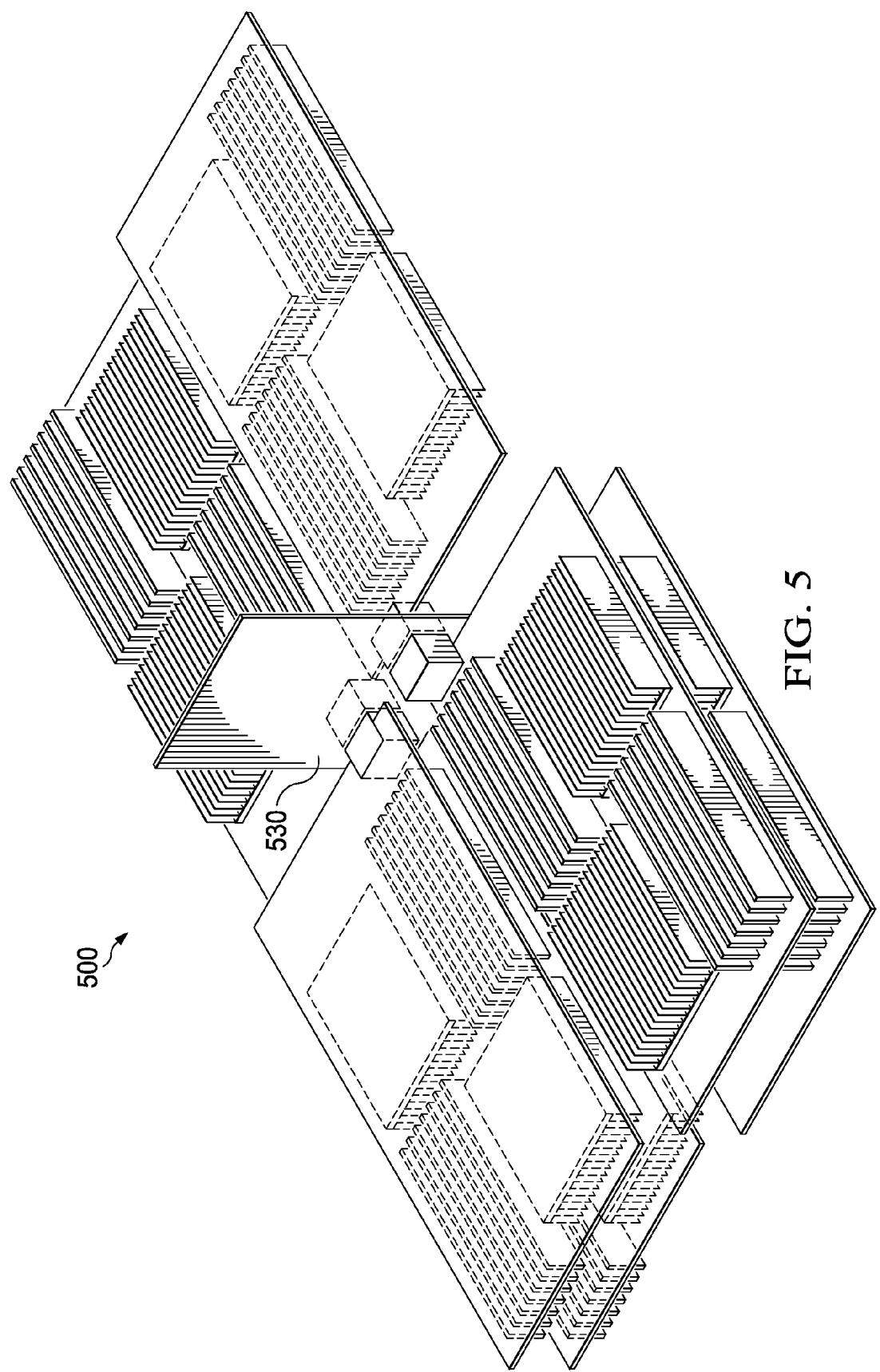
FIG. 5 illustrates yet another embodiment chassis architecture.

Notably, the embodiment chassis architecture 300 is configured to invert the line cards 311 in the column 310 in relation to the line cards 321 in the column 320 in order to allow the line cards 311, 321 to maintain a uniform configuration. The ability to use uniformly configured line cards in the columns 310, 320 may be beneficial in that it allows line cards to be interchanged between the columns 310, 320. However, aspects of this disclosure may also be implemented in chassis that utilize non-uniform line cards having a homogenous orientation, as demonstrated by the embodiment chassis architecture 400 in FIG. 4. The embodiment chassis architectures 300, 400 are depicted as having backplane configurations. However, aspects of this disclosure may also be applicable to chassis architectures that utilize midplane configuration, as demonstrated by the embodiment chassis architecture 500 in FIG. 5.

Figure 6:
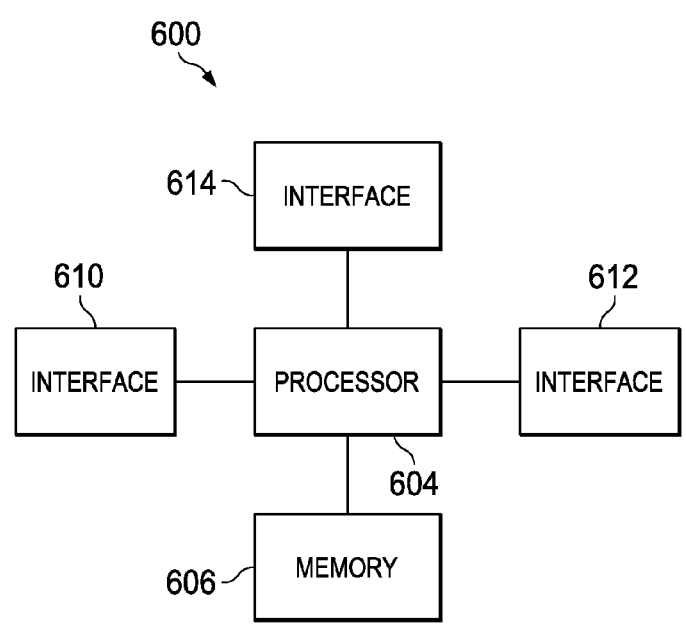
FIG. 6 illustrates a block diagram of an embodiment communications device.

FIG. 6 illustrates a block diagram of an embodiment processing device 600, which may used to operate and/or manufacture one or more of the embodiment chassis architectures and/or components described herein. The processing device 600 may include a processor 604, a memory 606, and a plurality of interfaces 610-614, which may (or may not) be arranged as shown in FIG. 6. The processor 604 may be any component capable of performing computations and/or other processing related tasks, and the memory 606 may be any component capable of storing programming and/or instructions for the processor 604. The interfaces 610-614 may be any component or collection of components that allows the processing device 600 to communicate data or control information to an external device or system.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A chassis architecture comprising:
   a connection plane comprising a first column of interconnections and a second column of interconnections, wherein the first column of interconnections runs parallel to the second column interconnections over the connection plane, and wherein a spacing between perpendicularly adjacent interconnections in the first column of interconnections and the second column of interconnections is less than half the width of a single line card; and
   a plurality of line cards mounted to the connection plane, the plurality of line cards being arranged in a first column of line cards mounted to the first column of interconnections and a second column of line cards mounted to the second column of interconnections,
   wherein each of the interconnections is mounted to an edge of a corresponding one of the line cards, and wherein a contact between each of the interconnections and the edge of the corresponding line card is less than half the width of the corresponding line card.

2. The chassis architecture of claim 1, wherein the plurality of line cards share a uniform design configuration such that line cards in the first column of line cards are interchangeable with line cards in the second column of line cards without modifying the connection plane or the line cards.

3. The chassis architecture of claim 2, wherein line cards in the first column of line cards are inverted in relation to line cards in the second column of line cards.

4. The chassis architecture of claim 1, wherein the first column of interconnections and the second column of interconnections are affixed to a central structure of the connection plane.

5. The chassis architecture of claim 4, wherein the central structure comprises inter-line-card (inter-LC) channels linking interconnections in the first column of interconnections with perpendicularly adjacent interconnections in the second column of interconnections, and
   wherein each of the inter-LC channels has a length that is shorter than the width of a single line card.

6. The chassis architecture of claim 5, wherein each of the inter-LC channels has a length that is shorter than half the width of a single line card.

7. The chassis architecture of claim 1, further comprising:
   one or more active cooling components configured to circulate a convection-cooling air flow over the plurality of line cards, wherein the connection plane is positioned in-between the plurality of line cards and the one or more active cooling components.

8. The chassis architecture of claim 1, wherein the spacing between perpendicularly adjacent interconnections in the first column of interconnections and the second column of interconnections is less than one-quarter the width of a single line card.

9. A chassis architecture comprising:
   a connection plane comprising a first column of interconnections and a second column of interconnections, wherein the first column of interconnections runs parallel to the second column interconnections over the connection plane, and wherein a spacing between perpendicularly adjacent interconnections in the first column of interconnections and the second column of interconnections is less than half the width of a single line card;
   a plurality of line cards mounted to the connection plane, the plurality of line cards being arranged in a first column of line cards mounted to the first column of interconnections and a second column of line cards mounted to the second column of interconnections;
   one or more active cooling components configured to circulate a convection-cooling air flow over the plurality of line cards, wherein the connection plane is positioned in-between the plurality of line cards and the one or more active cooling components;
   an outer shell encasing the connection plane and the line cards;
   a first thermal throughway over which the convection-cooling air flow circulates past the connection plane and over the first column of line cards, the first thermal throughway comprising a contiguous cavity formed in-between the connection plane and the outer shell; and
   a second thermal throughway over which the convection-cooling air flow circulates past the connection plane and over the second column of line cards, the second thermal throughway comprising a contiguous cavity formed in-between the connection plane and the outer shell.

10. The chassis architecture of claim 9, wherein the first thermal throughway and the second thermal throughway are positioned on opposite sides of the connection plane.

11. The chassis architecture of claim 9, wherein the first thermal throughway is not bisected by the connection plane, and wherein the second thermal throughway is not bisected by the connection plane.

12. A connection plane adapted for use in a dual-column chassis architecture, the connection plane comprising:
    a printed circuit board (PCB) connection plane; and
    a plurality of line-card to connection-plane (LC-to-CP) interconnections affixed to the PCB connection plane, the plurality of LC-to-CP interconnections including a first column of LC-to-CP interconnections and a second column of LC-to-CP interconnections, wherein the second column of LC-to-CP connections runs parallel to the second column LC-to-CP interconnections to form pairs of perpendicularly adjacent LC-to-CP interconnections,
    wherein a spacing between respective interconnections in each pair of perpendicularly adjacent LC-to-CP interconnections is less than half the width of a single line card,
    wherein each of the LC-to-CP interconnections is adapted to mount to an edge of a corresponding one of a plurality of line cards, and wherein a contact between each of the LC-to-CP interconnections and the edge of the corresponding line card is less than half the width of the corresponding line card.

13. The connection plane of claim 12, wherein LC-to-CP interconnections in the second column of LC-to-CP interconnections are inverted in relation to LC-to-CP interconnections in the first column of LC-to-CP interconnections.

14. The connection plane of claim 12, wherein plurality of LC-to-CP interconnections are configured to support line cards having a uniform configuration such that line cards connected to the first column of LC-to-CP interconnections are interchangeable with line cards connected to the second column of LC-to-CP interconnections.

15. The connection plane of claim 14, wherein lines cards in the second column of LC-to-CP interconnections are inverted in relation to line cards supported by the first column of LC-to-CP interconnections.

16. The connection plane of claim 12, wherein the first column of LC-to-CP interconnections and the second column of LC-to-CP interconnections are affixed to a central structure of the PCB connection plane.

17. The connection plane of claim 12, wherein the central structure of the PCB connection plane is contiguous and devoid of throughways.

18. The connection plane of claim 12, wherein the central structure comprises inter-line-card (inter-LC) channels for linking respective interconnections in each pair of perpendicularly adjacent LC-to-CP interconnections, and
wherein each of the inter-LC channels has a length that is shorter than the width of a line card.

19. The connection plane of claim 18, wherein each of the inter-LC channels has a length that is shorter than half the width of a line card.

20. The connection plane of claim 12, wherein the spacing between perpendicularly adjacent LC-to-CP interconnections is less than one-quarter the width of a single line card.

* * * * *